US010955476B2

(12) United States Patent
Tsai et al.

(10) Patent No.: US 10,955,476 B2
(45) Date of Patent: Mar. 23, 2021

(54) UNLIMITED MULTIPLEXING TESTING SYSTEM FOR PRESS TYPE SWITCH

(71) Applicant: PRIMAX ELECTRONICS LTD., Taipei (TW)

(72) Inventors: Cheng-Yi Tsai, Taipei (TW); Che-Yen Huang, Taipei (TW); Ying-Che Tseng, Taipei (TW); Shi-Jie Zhang, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 111 days.

(21) Appl. No.: 16/548,082

(22) Filed: Aug. 22, 2019

(65) Prior Publication Data

US 2020/0400744 A1    Dec. 24, 2020

(30) Foreign Application Priority Data

Jun. 21, 2019   (TW) .................................. 108121782

(51) Int. Cl.
*G01R 31/327*    (2006.01)
(52) U.S. Cl.
CPC ................................ *G01R 31/3277* (2013.01)
(58) Field of Classification Search
CPC .. G01M 13/00; G01M 99/007; G01M 99/008; H01H 2229/018; G01R 31/3277
See application file for complete search history.

(56) References Cited

U.S. PATENT DOCUMENTS

| 4,100,601 | A | * | 7/1978 | Kaufman | G06F 11/10 |
| | | | | | 370/463 |
| 6,648,531 | B1 | * | 11/2003 | Goldberg | G06F 3/0202 |
| | | | | | 400/473 |
| 2013/0294255 | A1 | * | 11/2013 | Olgaard | H04L 43/00 |
| | | | | | 370/242 |
| 2017/0279945 | A1 | * | 9/2017 | Parsons | A47B 88/407 |

* cited by examiner

*Primary Examiner* — Noam Reisner
(74) *Attorney, Agent, or Firm* — WPAT, PC

(57) ABSTRACT

Disclosures of the present invention describe an unlimited multiplexing testing system for press type switch, which mainly consists of a main board, a plurality of fixing bases, a test controlling module, a first interface unit, a button punching module, and a host device. Particularly, this novel unlimited multiplexing testing system is able to apply at least one button punching test procedure to a great quantity of mechanical switch components, keyboards or computer mice, thereby completing any one type of standard button punching test, such as life cycle test, loading test or endurance test. On the other hand, this unlimited multiplexing testing system can also be adopted for achieving any one of the foregoing standard button punching tests on the mechanical switch components, keyboards and computer mice, simultaneously.

12 Claims, 9 Drawing Sheets

UNLIMITED MULTIPLEXING TESTING SYSTEM FOR PRESS TYPE SWITCH

FIELD OF THE INVENTION

The present invention relates to the field of testing systems, and in particular, to an unlimited multiplexing testing system for press type switch.

BACKGROUND OF THE INVENTION

It is well known that an electronic device certainly has a switch unit that is configured for a user to press, thereby powering the electronic device ON or OFF. In addition, the electronic device also commonly has a plurality of functional key-press buttons or a keyboard for the user to input at least one operation signal or command to a main controller or a microprocessor of the electronic device. It is worth explaining that, in spite of the fact that touch panel has been widely applied in various commercial electronic devices, keyboard and computer mouse does still be a necessary inputting device of the commercial electronic devices.

Engineers skilled in development and manufacture of keyboards and computer mice have known that, mechanical switch is the most essential component for manufacturing one keyboard and/or one computer mouse. As described more in detail below, there is one mechanical switch component disposed below each button of the keyboard, and two respective micro-switch components are disposed below the left mouse button and the right mouse button of the computer mouse. Therefore, for effectively controlling the product quality of computer mice and keyboards, provider of the mechanical switch components is demanded by manufacturer of the computer mice and keyboards in guaranteeing that each one of the provided mechanical switch components has been passed all standard button punching tests, including life cycle test, loading test and endurance test. Of course, after using the mechanical switch components to manufacture the computer mice and keyboards, each of the computer mice and keyboards is also required to pass the standard button punching tests.

However, since the mechanical switch, the keyboard and the computer mouse all have an exclusive button (switch) testing machine thereof, there is a lack of a particularly-designed multi-function button (switch) testing machine for use in simultaneously applying any one type of the standard button punching tests to the mechanical switch, the keyboard and the computer mouse. On the other hand, in practical use, the exclusive switch testing machine is found showing a main drawback that is the exclusive switch testing machine can merely apply one type of the standard button punching test to a limited number of the mechanical switches. Moreover, the exclusive button testing machine for the keyboard or the computer mouse also exhibits the same shortcoming in practical use.

From above descriptions, it should know that there is room for improvement in the conventional button (switch) testing machine. In view of that, inventors of the present application have made great efforts to make inventive research and eventually provided an unlimited multiplexing testing system for press type switch.

SUMMARY OF THE INVENTION

A primary objective of the present invention is to provide an unlimited multiplexing testing system for press type switch, which is able to apply at least one button punching test procedure to a great quantity of mechanical switch components, keyboards or computer mice, thereby completing any one type of standard button punching test, such as life cycle test, loading test or endurance test. On the other hand, this unlimited multiplexing testing system can also be adopted for achieving any one of the foregoing standard button punching tests on the mechanical switch components, keyboards and computer mice, simultaneously.

To achieve the foregoing objective, the present invention provides one embodiment for the unlimited multiplexing testing system for press type switch, comprising:

a board, being provided a plurality of electrical connection units thereon;

a plurality of fixing bases, being disposed on the board; wherein a plurality of objects that are pending to be tested are respectively disposed in the plurality of fixing bases, thereby making the plurality of objects be electrically connected with the plurality of electrical connection units, respectively;

a test controlling module, being disposed on the board, and having a first communication unit;

a first interface unit, being coupled between the test controlling module and the plurality of electrical connection units thereon;

a button punching module, being located over the plurality of fixing bases, and being controlled by the test controlling module; and a host device having a test mode decision unit and a second communication unit;

wherein each of the plurality of objects has a key-press portion, and the test mode decision unit being configured for deciding a specific test mode according to a type of the object;

wherein the host device transmits a signal of the specific test mode to the test controlling module via the second communication unit and the first communication unit, such that the button punching module is controlled by the test controlling module so as to apply at least one button punching test procedure to the plurality of objects based on the specific test mode.

In the embodiment of the foregoing unlimited multiplexing testing system, the plurality of fixing bases comprises:

a plurality of first fixing bases, wherein each of the plurality of first fixing bases has a first accommodation space;

a plurality of second fixing bases, wherein each of the plurality of second fixing bases has a second accommodation space that is smaller than the first accommodation space; and a plurality of third fixing bases, wherein each of the plurality of third fixing bases has a third accommodation space that is smaller than the second accommodation space.

In the embodiment of the foregoing unlimited multiplexing testing system, the object is selected from the group consisting of a mechanical switch component, a computer mouse, a keyboard, and a set of key-press buttons.

In the embodiment of the foregoing unlimited multiplexing testing system, the button punching module comprises a plurality of punching units, and the punching units comprises:

a plurality of first punching units, wherein each of the first punching units has a first punching head with a first contact area;

a plurality of second punching units, wherein each of the second punching units has a second punching head with a second contact area, and the second contact area being smaller than the first contact area; and a third of second punching units, wherein each of the third punching units has a third punching head with a third contact area, and the third contact area being smaller than the second contact area.

In the embodiment of the foregoing unlimited multiplexing testing system, the electrical connection unit is selected from the group consisting of an electrical contact and a set of electrical contacts.

In the embodiment of the foregoing unlimited multiplexing testing system, the first interface unit is a wired connection interface, and the test controlling module further comprises a second interface unit, wherein the second interface unit is a wireless connection interface.

In the embodiment of the foregoing unlimited multiplexing testing system, the host device has an electronic tag unit that is configured for generating a plurality of electronic tags corresponding to the plurality of objects, such that the host device transmits the plurality of electronic tags to the test controlling module via the second communication unit and the first communication unit.

In the embodiment of the foregoing unlimited multiplexing testing system, the host device is selected from the group consisting of industrial computer, server computer, desk computer, laptop computer, tablet computer, and smart phone; moreover, each of the test mode decision unit and the electronic tag unit is provided in the host device by a form of application program, library, variables, or operands.

In the embodiment of the foregoing unlimited multiplexing testing system, each of the second communication unit and the first communication unit is selected from the group consisting of wireless communication interface and wired communication interface.

In the embodiment of the foregoing unlimited multiplexing testing system, the test controlling module further comprises:

a test mode recording unit for recording the test mode that is transmitted from the host device;

an electronic tag recording unit, being configured for recording the electronic tags transmitted from the host device;

a punching number counter, being configured for counting a statistical punching number of each of the punching units; and an effective punching number counter, being configured for counting an effective punching number of each of the punching units.

DETAILED DESCRIPTION OF THE PREFERRED EMBODIMENT

The advantages and features of an unlimited multiplexing testing system for press type switch according to the present invention are described in details with reference to examples of embodiments and accompanying drawings to be more easily understood. However, the present invention may be implemented in different forms, and should not be construed as limited to only embodiments described herein. Conversely, for a person skilled in the art, the embodiments are provided for making the disclosure more thorough and comprehensive and completely conveying the scope of the present invention.

First Embodiment

Figure 1:
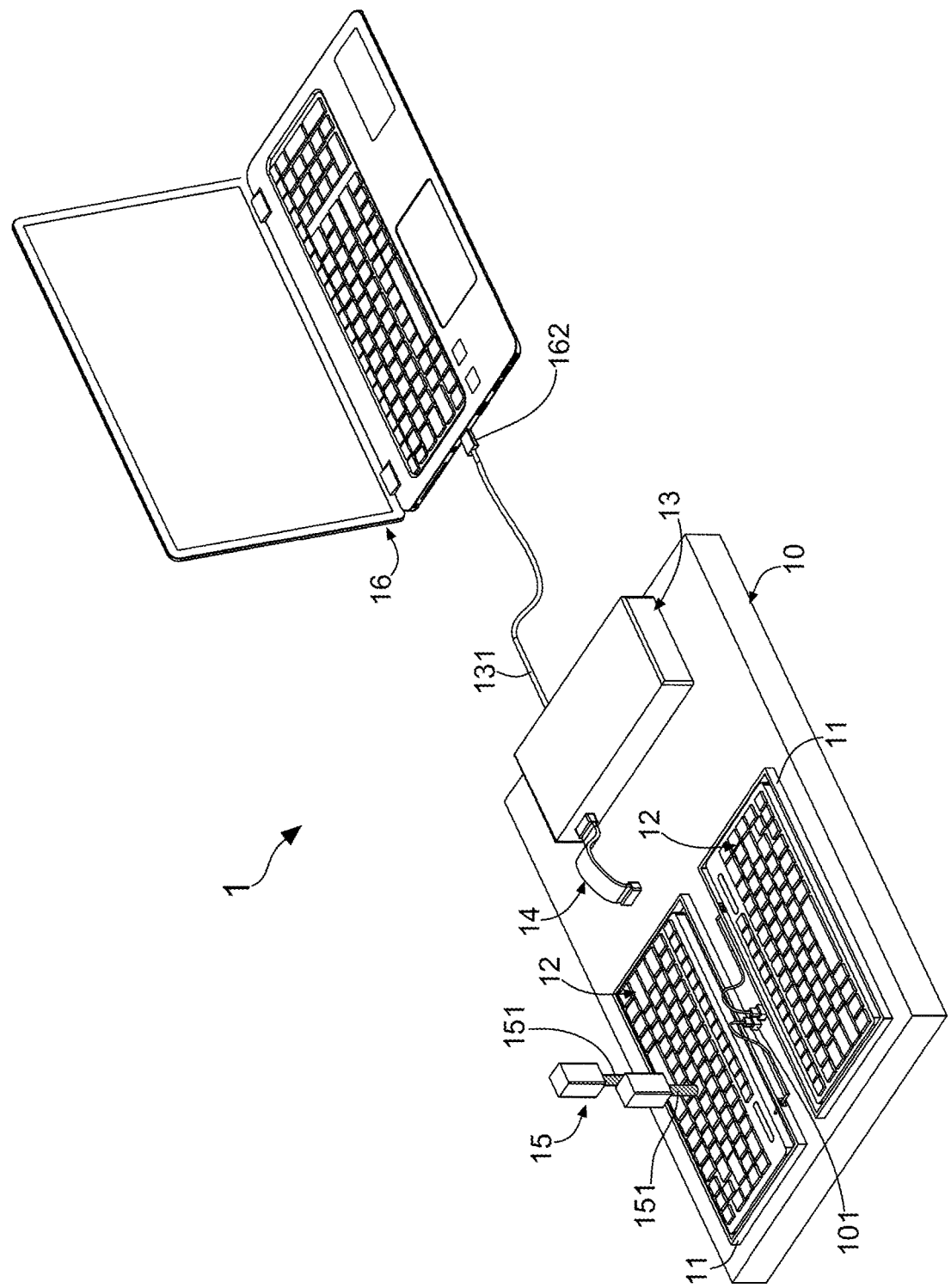
FIG. 1 shows a stereo diagram of a first embodiment of an unlimited multiplexing testing system for press type switch according to the present invention.

With reference to FIG. 1, there is provided a stereo diagram of a first embodiment of an unlimited multiplexing testing system for press type switch according to the present invention. As FIG. 1 shows, the unlimited multiplexing testing system 1 of the present invention comprises: a board 10, a plurality of fixing bases 11, a test controlling module 13, a first interface unit 14, a button punching module 15, and a host device 16.

Figure 2:
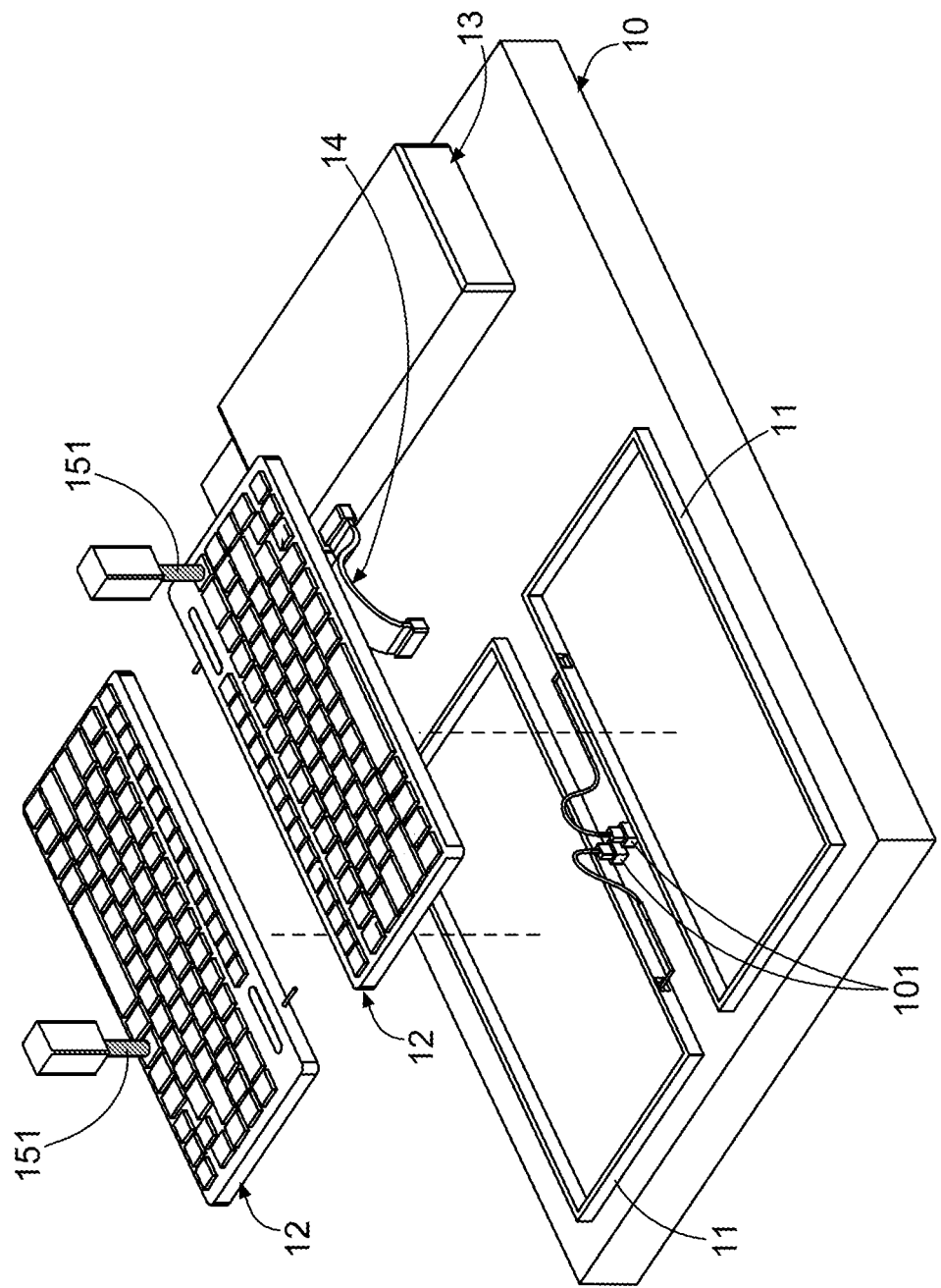
FIG. 2 shows a stereo diagram to depict a board, a plurality of fixing bases, a test controlling module, a first interface unit, and a button punching module for constituting the first embodiment of the unlimited multiplexing testing system.
Figure 3:
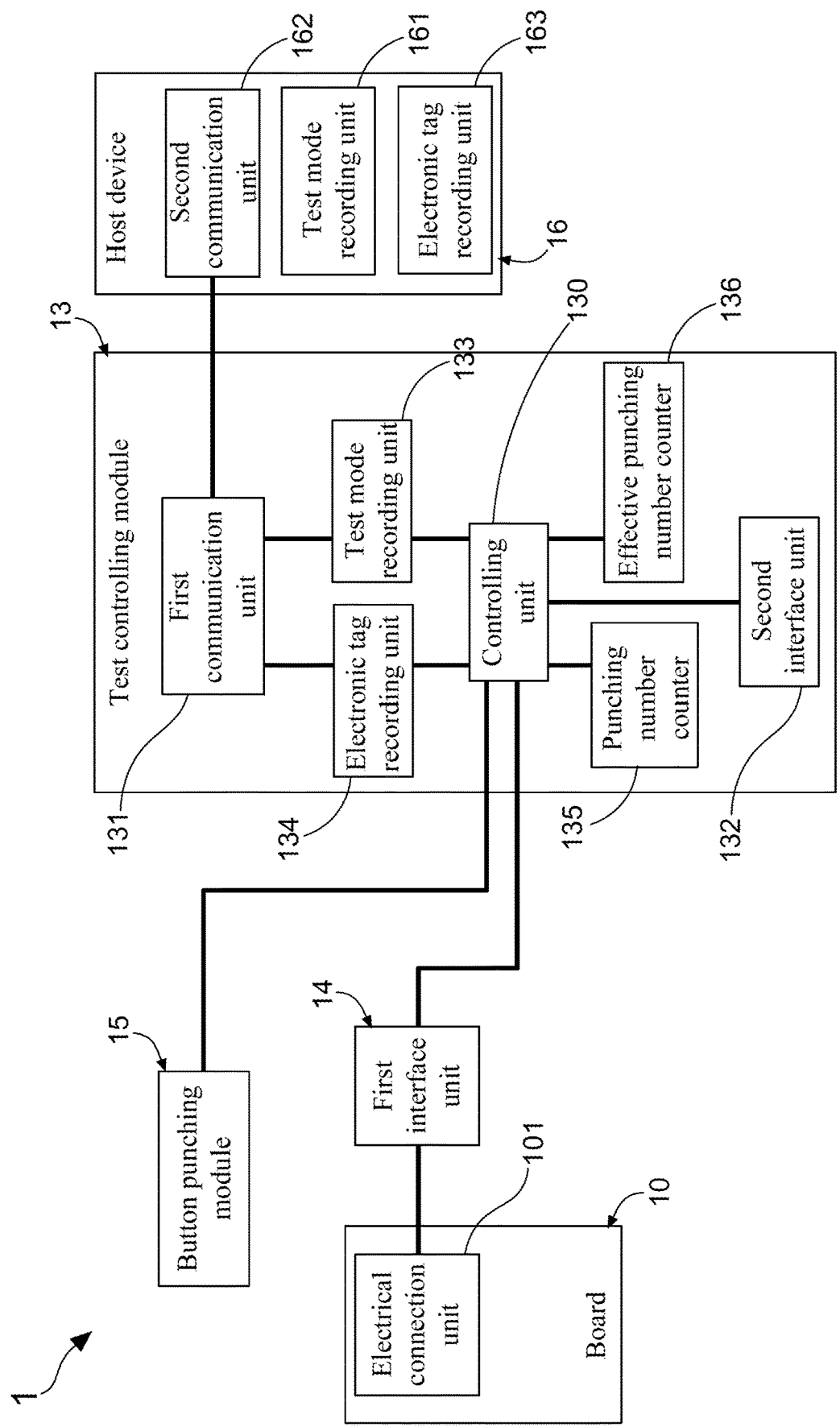
FIG. 3 shows a functional block diagram of the unlimited multiplexing testing system.

Continuously referring to FIG. 1, and please simultaneously refer to FIG. 2 and FIG. 3, wherein FIG. 2 illustrates a stereo diagram to depict the board 10, the plurality of fixing bases 11, the test controlling module 13, the first interface unit 14, and the button punching module 15 for constituting the first embodiment of the unlimited multiplexing testing system 1. On the other hand, FIG. 3 shows a functional block diagram of the unlimited multiplexing testing system 1. In first embodiment, the board 10 is provided a plurality of electrical connection units 101 thereon, and each of the plurality of electrical connection units 101 is presented by a form of an electrical connector. Moreover, the plurality of fixing bases 11 are disposed on the board 10, wherein a plurality of objects 12 that are pending to be tested are respectively disposed in the plurality of fixing bases 11, thereby making the plurality of objects 12 be electrically connected with the plurality of electrical connection units 101, respectively. Particularly, FIG. 1 and FIG. 2 all depict that the object 12 is a keyboard having a plurality of mechanical switch components. Moreover, the plurality of keyboards (i.e., objects 12) are respectively disposed in the plurality of fixing bases 11, and each of the keyboards is electrically connected to the corresponding electrical connection unit 101 by a USB connector thereof.

According to the particular design of the present invention, a test controlling module 13 is provided and disposed in the board 10. From FIG. 1, it is understood that the test controlling module 13 is electrically connected to the electrical connection units 101 through the first interface unit 14. As described more in detail below, the first interface unit 14 is an I/O interface, such that the test controlling module 13 is able to drive or control the keyboards (i.e., objects 12) disposed in the fixing base 11 via the first interface unit 14. Moreover, FIG. 1, FIG. 2 and FIG. 3 also illustrate that the test controlling module 13 mainly consists of a controlling unit 130, a first communication unit 131, a test mode recording unit 133, an electronic tag recording unit 134, a punching number counter 135, and an effective punching number counter 136.

As described more in detail below, the host device 16 is provided with a second communication unit 162, a test mode decision unit 161 and an electronic tag unit 163. In the present invention, the test mode decision unit 161 is configured for deciding a specific test mode (or a button punching test procedure) according to a type of the object 12, so as to make the test controlling module 13 control the button punching module 15 to apply at least one button punching test procedure to the keyboards (i.e., objects 12), thereby eventually completing any one type of standard button punching tests, such as life cycle test, loading test or endurance test. On the other hand, the electronic tag unit 163 is configured for generating a plurality of electronic tags corresponding to the plurality of objects 12, and then the host device 166 transmits the plurality of electronic tags to the test controlling module 13 after a communication channel is established for bridging the first communication unit 131 and the second communication 162. After that, the test mode recording unit 133 would record the test mode that is transmitted from the host device 15, and the electronic tag recording unit 134 records the electronic tags transmitted from the host device 15.

FIG. 1 and FIG. 2 all depict that both the second communication unit 162 and the first communication unit 131 are a wired communication unit. However, that should not become a limitation in practicable type of the two communication units. In a practicable embodiment, both the second communication unit 162 and the first communication unit 131 can also be a WiFi communication unit, Bluetooth communication unit, or a Zigbee communication unit. In addition, the host device 16 can also be an industrial computer, a server computer, a desk computer, a tablet computer, or a smart phone despite the fact that FIG. 1 depicts the host device 16 by a form of a laptop computer. Moreover, it is easily extrapolated that, each of the test mode decision unit 161 and the electronic tag unit 163 is provided in the host device 16 by a form of application program, library, variables, or operands.

It needs to further explain that, although FIG. 1 and FIG. 2 all depict that the first embodiment of the unlimited multiplexing testing system 1 is mainly utilized for testing whether the key-press buttons of wired keyboards is normal or not, that is not used for limiting the practicable application of the unlimited multiplexing testing system 1. In a practicable application, the first embodiment of the unlimited multiplexing testing system 1 can also be adopted for applying one specific type of standard button punching test to one or more wireless keyboards. In such case, the respective wireless keyboards (i.e., objects 12) are coupled to the respective electrical connection units 101 by their wireless USB dongles. On the other hand, as FIG. 3 shows, the test controlling module 13 further comprises a second interface unit 132, wherein the second interface unit 132 is a wireless connection interface. Thus, if there are specific wireless keyboards not consisting wireless USB dongle, these specific wireless keyboards can also be coupled to the second interface unit 132 of the test controlling module 13 by a direct wireless connection.

Therefore, above descriptions have introduced the first embodiment of the unlimited multiplexing testing system 1 for press type switch according to the present invention. Subsequently, the above-mentioned button punching test procedure will be detail introduced in following paragraphs. Please refer to FIG. 1, FIG. 2 and FIG. 3 again. First of all, a few of keyboards (i.e., objects 12) are disposed in corresponding fixing bases 11 of the board 10, and then letting each of the keyboards be electrically connected to the each of the electrical connection units 101 by a USB connector thereof. Next, after establishing a communication channel between the second communication unit 162 of the host device 16 and the first communication unit 131 of the test controlling module 13, a specific test mode that is suitable for the keyboards and a plurality electronic tags corresponding to the keyboards are transmitted to the test controlling module 13 from the host device 16. After that, the test mode recording unit 133 and the electronic tag recording unit 134 would record the test mode and the electronic tags that are transmitted from the host device 15. It is worth noting that, after the communication channel between the second communication unit 162 and the first communication unit 131 is interrupted, the button punching module 15 is controlled by the test controlling module 13 so as to apply at least one button punching test procedure to the keyboards based on the specific test mode, thereby completing any one type of standard button punching test, such as life cycle test, loading test or endurance test.

FIG. 1 and FIG. 2 depict that the button punching module 15 comprises a plurality of punching units 151. During the button punching test, the punching number counter 135 is configured for counting a statistical punching number of each of the punching units 151, and the effective punching number counter is adopted for counting an effective punching number of each of the punching units 151. After completing the button punching test procedure, the communication channel for bridging the first communication unit 131 and the second communication 162 is established again, such that the host device 16 receives related test data from the test controlling module 13, including data of the statistical punching number and data of the effective punching number. As a result, the host device 16 is able to judge whether the keyboards (i.e., objects 12) under test pass the specific type of type of standard button punching test or not.

It is easily extrapolated that, by increasing a number of the fixing bases 11 on the board 10, the button punching module 15 can be controlled by the test controlling module 13 so as to achieve at least one specific type of standard button punching test for a great quantity of keyboards (i.e., objects 12) that are disposed in the corresponding fixing bases 11.

Second Embodiment

Figure 4:
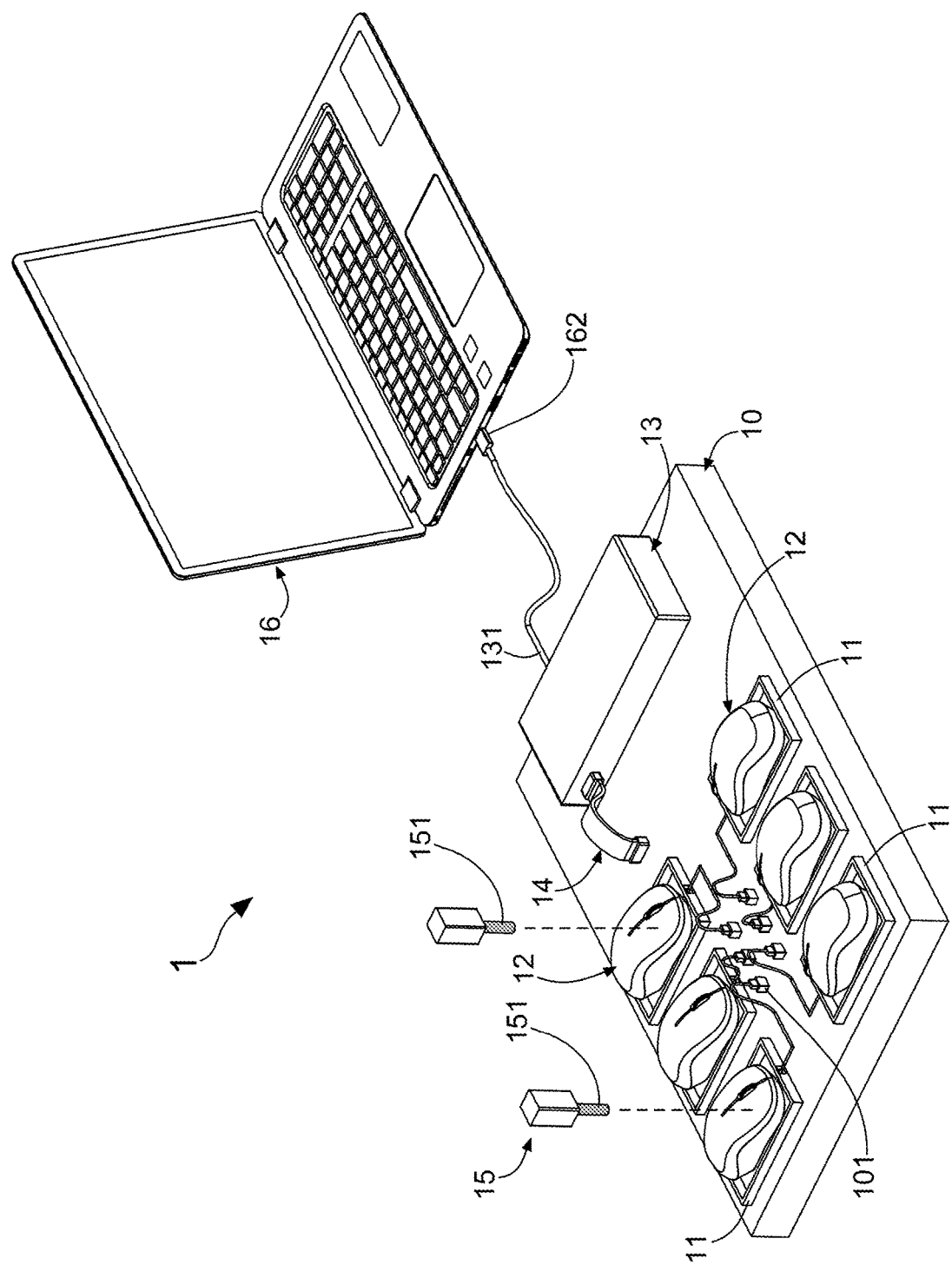
FIG. 4 shows a stereo diagram of a second embodiment of the unlimited multiplexing testing system for press type switch.
Figure 5:
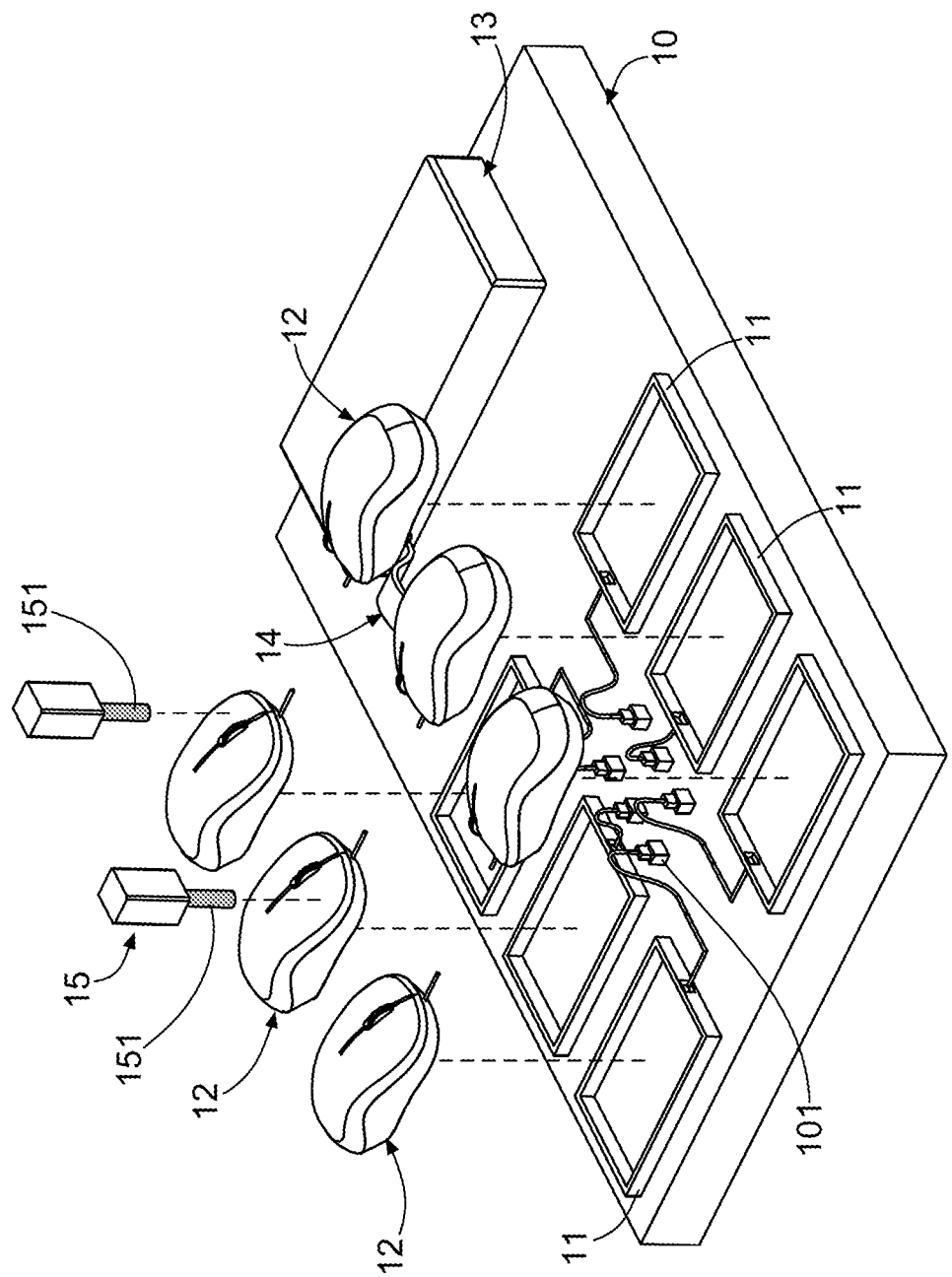
FIG. 5 shows a stereo diagram to depict the board, the plurality of fixing bases, the test controlling module, the first interface unit, and the button punching module for constituting the second embodiment of the unlimited multiplexing testing system.

FIG. 4 shows a stereo diagram of a second embodiment of the unlimited multiplexing testing system for press type switch. In second embodiment, the unlimited multiplexing testing system 1 also comprises: a board 10, a plurality of fixing bases 11, a test controlling module 13, a first interface unit 14, a button punching module 15, and a host device 16. In addition, FIG. 5 shows a stereo diagram to depict the board 10, the fixing bases 11, the test controlling module 13, the first interface unit 14, and the button punching module 15 for constituting the second embodiment of the unlimited multiplexing testing system 1. After comparing FIG. 5 with FIG. 2, it can find that an accommodation space of the fixing base 11 shown in FIG. 5 is smaller than that of the fixing base 11 illustrated in FIG. 2. Particularly, FIG. 4 and FIG. 5 all depict that the object 12 is a computer mouse. It is known that the computer mouse is one type of inputting device, and there are two respective micro-switches disposed below the left mouse button and the right mouse button of the computer mouse. Moreover, from FIG. 4 and FIG. 5, it is understood that the computer mice (i.e., objects 12) that are pending to be tested are disposed in the corresponding fixing bases 11, and each of the computer mouse is electrically connected to the electrical connection unit 101 by a USE connector thereof.

Therefore, from the first embodiment presented by FIG. 1 and FIG. 2 as well as the second embodiment presented by FIG. 4 and FIG. 5, it should be aware of that, this unlimited multiplexing testing system 1 is able to apply at least one button punching test procedure to a great quantity of keyboards or computer mice, thereby completing any one type of standard button punching test, such as life cycle test, loading test or endurance test. In other words, in the case of using this unlimited multiplexing testing system 1, it is helpful for the manufacturer of computer mice and keyboards to save the test time and cost that are spent on the standard button punching test(s) of the end products of computer mice and keyboards.

Third Embodiment

Figure 6:
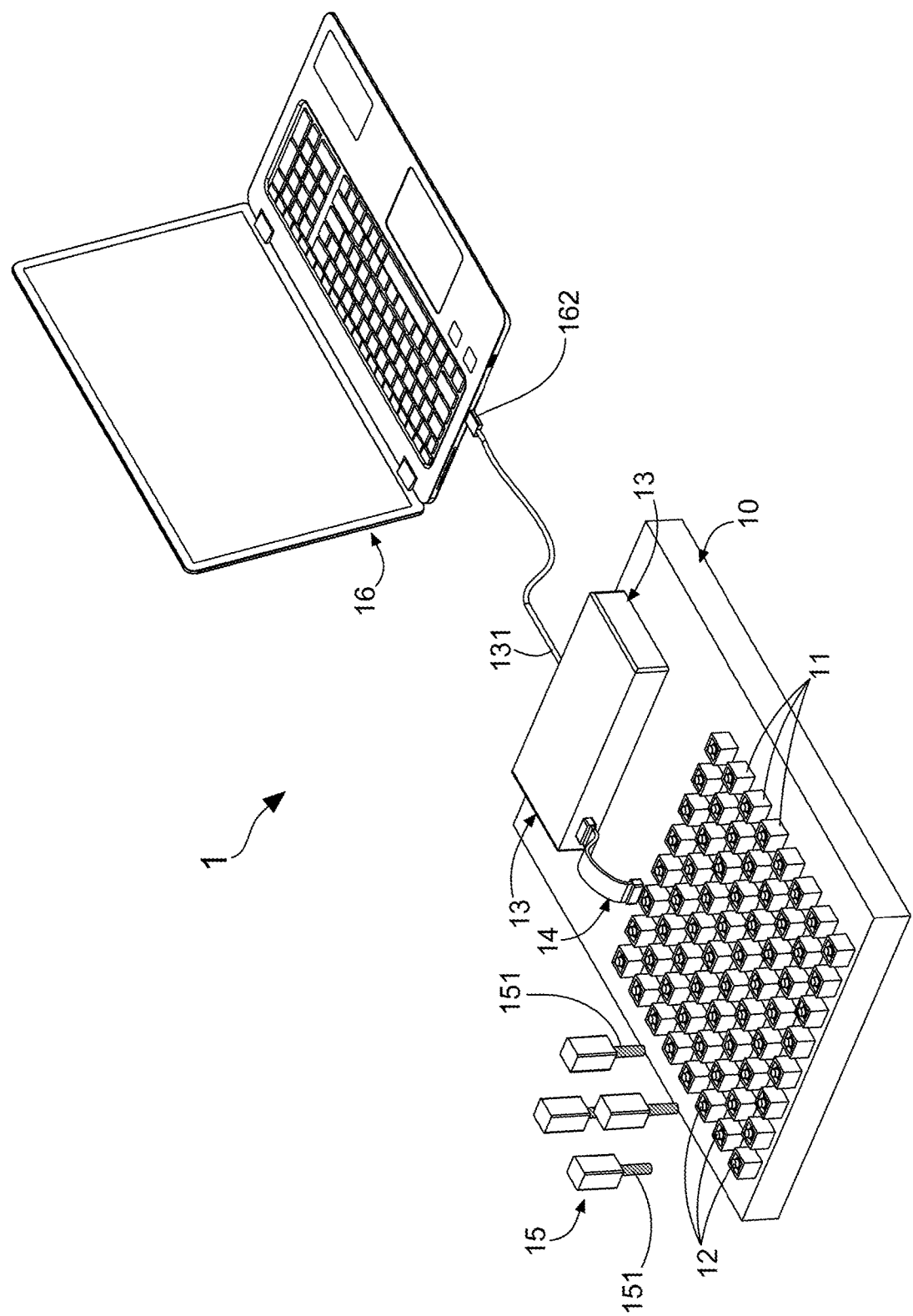
FIG. 6 shows a stereo diagram of a third embodiment of the unlimited multiplexing testing system for press type switch.
Figure 7:
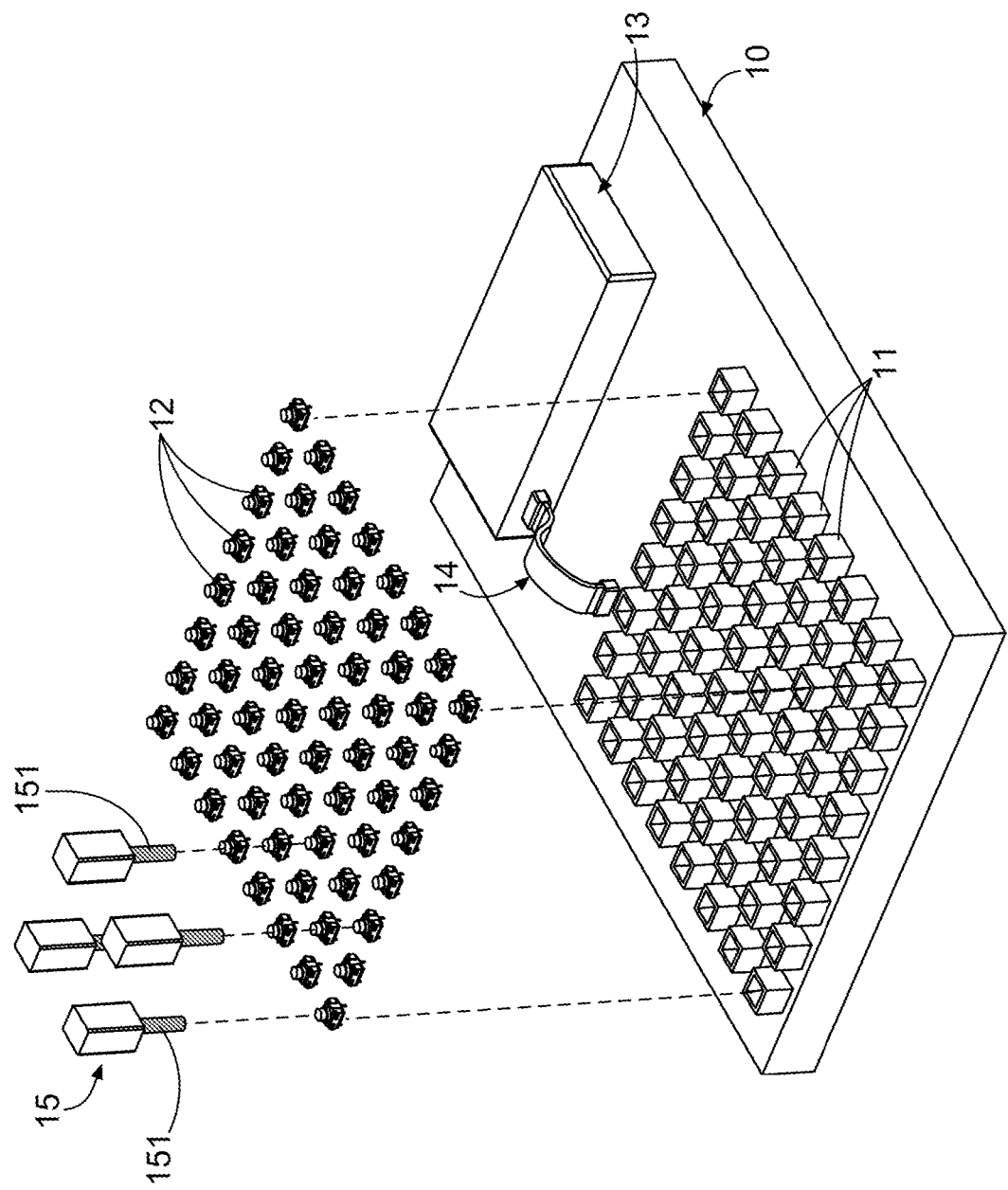
FIG. 7 shows a stereo diagram to depict the board, the plurality of fixing bases, the test controlling module, the first interface unit, and the button punching module for constituting the third embodiment of the unlimited multiplexing testing system.

FIG. 6 shows a stereo diagram of a third embodiment of the unlimited multiplexing testing system for press type switch. In third embodiment, the unlimited multiplexing testing system 1 also comprises: a board 10, a plurality of fixing bases 11, a test controlling module 13, a first interface unit 14, a button punching module 15, and a host device 16. In addition, FIG. 7 shows a stereo diagram to depict the board 10, the fixing bases 11, the test controlling module 13, the first interface unit 14, and the button punching module 15 for constituting the third embodiment of the unlimited multiplexing testing system 1. After comparing FIG. 7 with FIG. 2 and/or FIG. 5, it should find that an accommodation space of the fixing base 11 shown in FIG. 7 is smaller than that of the fixing base 11 illustrated in FIG. 5. Particularly, FIG. 6 and FIG. 7 all depict that the object 12 is a mechanical switch component. It is known that the mechanical switch component the most essential component for manufacturing one computer mouse and/or one keyboard. Moreover, from FIG. 6 and FIG. 7, it is understood that the mechanical switch components (i.e., objects 12) that are pending to be tested are disposed in the corresponding fixing bases 11.

In third embodiment, the fixing base 11 is presented by a form of electrical socket for receiving the mechanical switch component, and the each of the electrical connection units 101 is presented by a form of a set of electrical contacts. By such arrangement, each of the mechanical switch components can be electrically connected to the each of the electrical connection units 101 through the electrical socket (i.e., fixing base 11). It is worth noting that, due to the covering of the electrical socket, the foregoing electrical contacts fail to show in FIG. 6 and FIG. 7.

Therefore, from the third embodiment presented by FIG. 3, it should be aware of that, this unlimited multiplexing testing system 1 can also apply at least one button punching test procedure to a great quantity of mechanical switch components, thereby completing any one type of standard button punching test, such as life cycle test, loading test or endurance test. In other words, in the case of using this unlimited multiplexing testing system 1, it is helpful for the provider of mechanical switch components to save the test time and cost that are spent on the standard button punching test(s) of the mechanical switch components.

Fourth Embodiment

Figure 8:
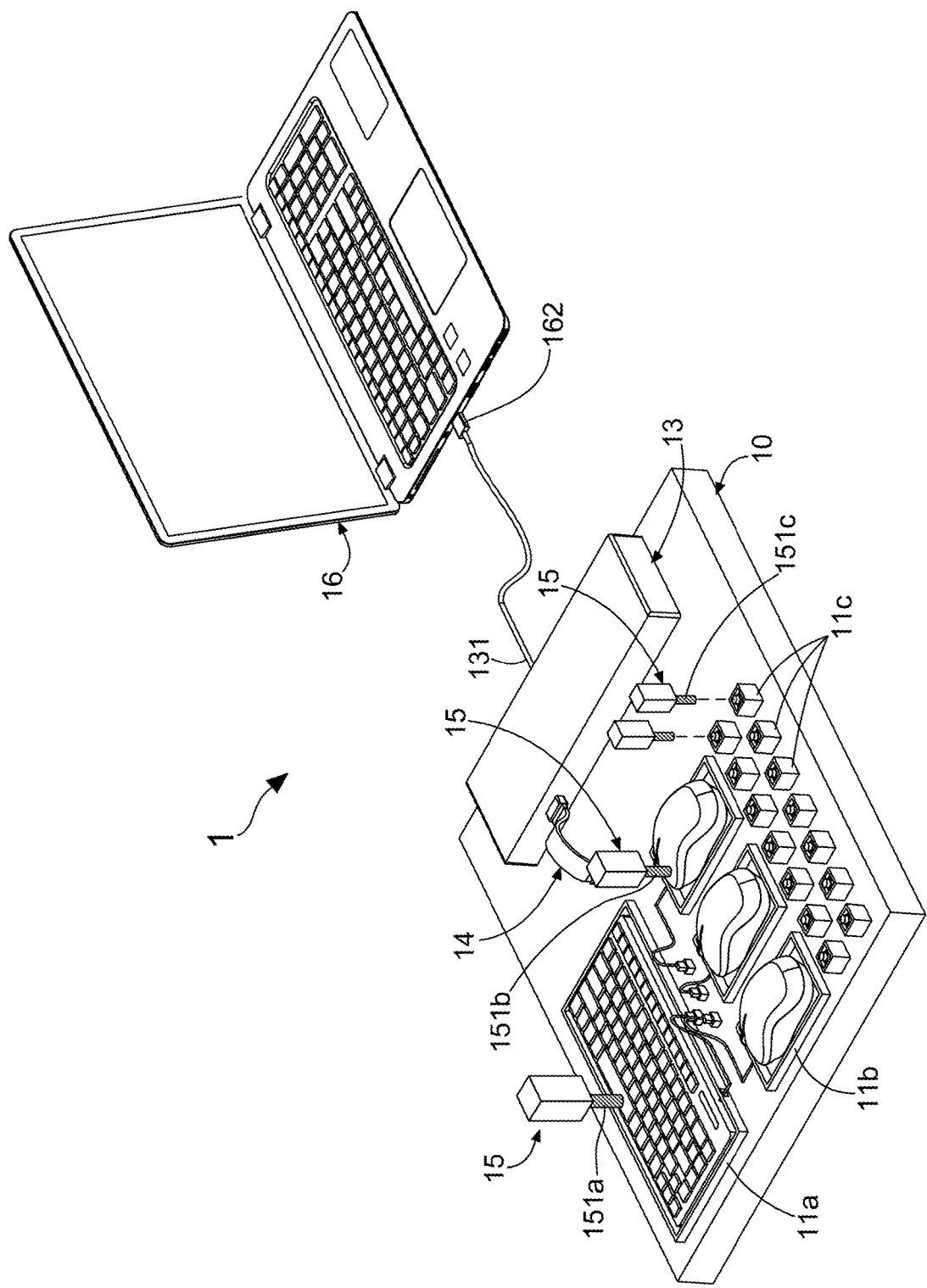
FIG. 8 shows a stereo diagram of a fourth embodiment of the unlimited multiplexing testing system for press type switch.
Figure 9:
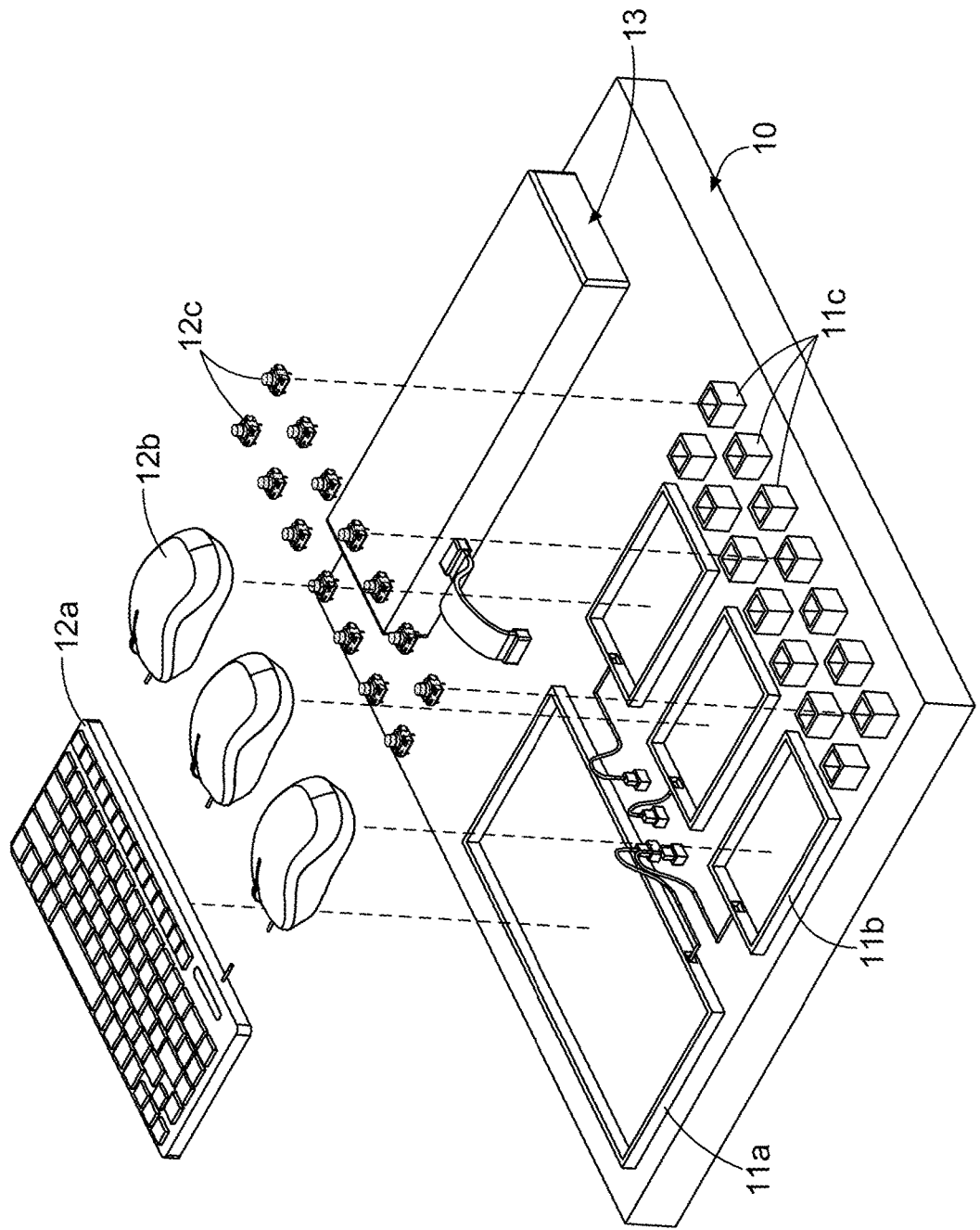
FIG. 9 shows a stereo diagram to depict the board, a plurality of first fixing bases, a plurality of second fixing bases, a plurality of third fixing bases, the test controlling module, the first interface unit, and the button punching module for constituting the fourth embodiment of the unlimited multiplexing testing system.

FIG. 8 shows a stereo diagram of a fourth embodiment of the unlimited multiplexing testing system for press type switch. In fourth embodiment, the unlimited multiplexing testing system 1 comprises: a board 10, a plurality of first fixing bases 11*a*, a plurality of second fixing bases 11*b*, a plurality of third fixing bases 11*c*, a test controlling module 13, a first interface unit 14, a button punching module 15, and a host device 16. In addition, FIG. 9 shows a stereo diagram to depict the board 10, the plurality of first fixing bases 11*a*, the plurality of second fixing bases 11*b*, the plurality of third fixing bases 11*c*, the test controlling module 13, the first interface unit 14, and the button punching module 15 for constituting the fourth embodiment of the unlimited multiplexing testing system 1. It is easily understood that, in the fourth embodiment, this unlimited multiplexing testing system 1 can be adopted for achieving any one of the foregoing standard button punching tests on the mechanical switch components, keyboards and computer mice, simultaneously.

As FIG. 8 and FIG. 9 show, each of the first fixing base 11*a* has a first accommodation space for receiving a first object 12*a* (keyboard), each of the second fixing base 11*b* has a second accommodation space for receiving a second object 12*b* (computer mouse), and each of the third fixing base 11*c* has a third accommodation space for receiving a third object 12*c* (mechanical switch component). Moreover, the second accommodation space is smaller than the first accommodation space, and the third accommodation space that is smaller than the second accommodation space. On the other hand, the button punching module 15 comprises: a plurality of first punching units 151*a*, a plurality of second punching units 151*b* and a plurality of third punching units 151*c*. In which, each of the first punching units 151*a* has a first punching head with a first contact area, each of the second punching units 151*b* has a second punching head with a second contact area, and each of the third punching units 151*c* has a third punching head with a third contact area. In the fourth embodiment, particularly, the second contact area is smaller than the first contact area, and the third contact area is smaller than the second contact area.

Through above descriptions, all embodiments and their constituting elements of the unlimited multiplexing testing system 1 for press type switch proposed by the present invention have been introduced completely and clearly; in summary, the present invention includes the advantages of:

(1) The unlimited multiplexing testing system 1 mainly consists of a main board 10, a plurality of fixing bases 11, a test controlling module 13, a first interface unit 14, a button punching module 15, and a host device 16. In the present invention, the host device 16 has a test mode decision unit 161 and a second communication unit 163, and the button punching module 15 is located over the fixing bases 11. After one or more objects 12 that has at least one key-press portion are disposed in the corresponding fixing bases 11, the test mode decision unit 161 subsequently decides a specific test mode according to a type of the object, such that the host device 16 transmit a signal of the specific test mode to the test controlling module 13. Therefore, the button punching module 15 is controlled by the test controlling module 13 so as to apply at least one button punching test procedure to the objects 12 based on the specific test mode. Particularly, this novel unlimited multiplexing testing system 1 is able to apply at least one button punching test procedure to a great quantity of objects 12 (like keyboards or computer mice). Therefore, in the case of using this unlimited multiplexing testing system 1, it is helpful for the manufacturer of computer mice and keyboards to save the test time and cost that are spent on the standard button punching test(s) of the end products of computer mice and keyboards.

(2) Moreover, this unlimited multiplexing testing system 1 can also apply at least one button punching test procedure to a great quantity of mechanical switch components. Thus, in the case of using this unlimited multiplexing testing system 1, it is helpful for the provider of mechanical switch components to save the test time and cost that are spent on the standard button punching test(s) of the mechanical switch components. On the other hand, this unlimited multiplexing testing system 1 can also be adopted for achieving any one of the foregoing standard button punching tests on the mechanical switch components, keyboards and computer mice, simultaneously.

Any modification to the present invention made by a person skilled in the art does not depart from the protection scope defined by the appended claims.

What is claimed is:

1. A multiplexing testing system for press type switch, comprising:
   a board, being provided a plurality of electrical connection units thereon;
   a plurality of fixing bases, being disposed on the board; wherein a plurality of objects that are pending to be tested are respectively disposed in the plurality of fixing bases, thereby making the plurality of objects be electrically connected with the plurality of electrical connection units, respectively;
   a test controlling module, being disposed on the board, and having a first communication unit;
   a first interface unit, being coupled between the test controlling module and the plurality of electrical connection units thereon;
   a button punching module, being located over the plurality of fixing bases, and being controlled by the test controlling module; and
   a host device having a test mode decision unit and a second communication unit;
   wherein each of the plurality of objects has a key-press portion, and the test mode decision unit being configured for deciding a specific test mode according to a type of the object, wherein the plurality of objects are composed of at least two different types of objects, and wherein the types of objects consist of: a mechanical switch component, a computer mouse, or a keyboard;
   wherein the host device transmits a signal of the specific test mode to the test controlling module via the second communication unit and the first communication unit, such that the button punching module is controlled by the test controlling module so as to apply at least one button punching test procedure to the plurality of objects based on the specific test mode.

2. The multiplexing testing system according to claim 1, wherein the plurality of fixing bases comprises:
   a plurality of first fixing bases, wherein each of the plurality of first fixing bases has a first accommodation space;
   a plurality of second fixing bases, wherein each of the plurality of second fixing bases has a second accommodation space that is smaller than the first accommodation space; and
   a plurality of third fixing bases, wherein each of the plurality of third fixing bases has a third accommodation space that is smaller than the second accommodation space.

3. The multiplexing testing system according to claim 1, wherein the button punching module comprises a plurality of punching units, and each of the punching units having a punching head.

4. The multiplexing testing system according to claim 3, wherein the host device has an electronic tag unit that is configured for generating a plurality of electronic tags corresponding to the plurality of objects, such that the host device transmits the plurality of electronic tags to the test controlling module via the second communication unit and the first communication unit.

5. The multiplexing testing system according to claim 4, wherein the host device is selected from the group consisting of industrial computer, server computer, desk computer, laptop computer, tablet computer, and smart phone.

6. The multiplexing testing system according to claim 5, wherein each of the test mode decision unit and the electronic tag unit is provided in the host device by a form of application program, library, variables, or operands.

7. The multiplexing testing system according to claim 3, wherein the test controlling module further comprises:
   a test mode recording unit for recording the test mode that is transmitted from the host device; an electronic tag recording unit, being configured for recording the electronic tags transmitted from the host device;
   a punching number counter, being configured for counting a statistical punching number of each of the punching units; and
   an effective punching number counter, being configured for counting an effective punching number of each of the punching units.

8. The multiplexing testing system according to claim 1, wherein the button punching module comprises:
   a plurality of first punching units, wherein each of the first punching units has a first punching head with a first contact area;
   a plurality of second punching units, wherein each of the second punching units has a second punching head with a second contact area, and the second contact area being smaller than the first contact area; and
   a third of second punching units, wherein each of the third punching units has a third punching head with a third contact area, and the third contact area being smaller than the second contact area.

9. The multiplexing testing system according to claim 1, wherein the electrical connection unit is at least one electrical contact.

10. The multiplexing testing system according to claim 9, wherein the first interface unit is a wired connection interface.

11. The multiplexing testing system according to claim 10, wherein the test controlling module further comprises a second interface unit, and the second interface unit being a wireless connection interface.

12. The multiplexing testing system according to claim 1, wherein each of the second communication unit and the first communication unit is selected from the group consisting of wireless communication interface and wired communication interface.

* * * * *